United States Patent
Erhardt et al.

(12) 
(10) Patent No.: US 6,521,501 B1
(45) Date of Patent: Feb. 18, 2003

(54) METHOD OF FORMING A CMOS TRANSISTOR HAVING ULTRA SHALLOW SOURCE AND DRAIN REGIONS

(75) Inventors: Jeff Erhardt, San Jose, CA (US); Bin Yu, Sunnyvale, CA (US); G. Jonathan Kluth, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/310,170

(22) Filed: May 11, 1999

(51) Int. Cl.$^7$ ............................................. H01L 21/336
(52) U.S. Cl. ..................... 438/305; 438/301; 438/303; 438/514; 438/528; 438/557; 438/487
(58) Field of Search ................................. 438/305, 303, 438/301, 299, 298, 450, 502, 509, 514, 522, 487, 528, 557

(56) References Cited

U.S. PATENT DOCUMENTS

| | | | | |
|---|---|---|---|---|
| 5,401,666 A | * | 3/1995 | Tsukamoto | 437/41 |
| 5,474,940 A | * | 12/1995 | Tsukamoto | 437/19 |
| 5,536,684 A | * | 7/1996 | Dass et al. | 438/535 |
| 5,633,522 A | * | 5/1997 | Dorleans et al. | 257/344 |
| 5,654,237 A | * | 8/1997 | Suguro et al. | 438/624 |
| 5,908,307 A | * | 6/1999 | Talwar et al. | 438/199 |
| 5,956,603 A | * | 9/1999 | Talwar et al. | 438/520 |
| 5,981,372 A | * | 11/1999 | Goto et al. | 438/621 |
| 6,184,097 B1 | * | 2/2001 | Yu | 438/299 |

OTHER PUBLICATIONS

Talwar, et al., "Ultra–Shallow, Abrupt, and Highly–Activated Junctions by Low–Energy Ion Implantation and Laser Annealing", IEEE, Ion Implantation Technology Proceedings, pp. 1171–1174, Jun. 1998.*

* cited by examiner

Primary Examiner—Carl Whitehead, Jr.
Assistant Examiner—Christy Novacek
(74) Attorney, Agent, or Firm—Skjerven Morrill LLP

(57) ABSTRACT

A method of forming a CMOS structure, the method including the acts of: forming a gate structure over a substrate layer; forming a silicide layer over the substrate layer; forming shallow source/drain areas in the substrate layer; forming an oxide diffusion barrier layer over the structure; forming a metal absorption layer over the oxide diffusion barrier layer; and melting portions of the substrate layer directly overlying the shallow source/drain areas, thereby transforming the shallow source/drain areas into shallow source/drain regions. The act of melting includes the act of exposing the metal absorption layer to pulsed laser beams.

12 Claims, 5 Drawing Sheets

METHOD OF FORMING A CMOS TRANSISTOR HAVING ULTRA SHALLOW SOURCE AND DRAIN REGIONS

FIELD OF THE INVENTION

The present invention relates to transistor and more specifically to a method of forming transistors with ultra shallow source and drain regions.

BACKGROUND

Ultra large scale integration (ULSI) requires that complementary metal oxide semiconductors (CMOS) devices have very small device geometries. Thus, the capability of forming ultra shallow source/drain regions in CMOS devices is critical. At these very small geometries, careful attention must be paid to thermal cycles to which the CMOS device is subjected.

A conventional process for forming a CMOS device is described with respect to FIGS. 1A–1D. An oxide layer is formed over a conventional substrate layer 102 (e.g., a silicon wafer) by, for example, oxidizing the surface of the substrate layer 102. Next, a polycrystalline silicon ("polysilicon") layer is formed over the oxide layer by, e.g., a conventional chemical vapor deposition (CVD) technique. Portions of the polysilicon and oxide layers are removed by, e.g., a conventional etch technique, to produce oxide layer 104 and gate structure 106. FIG. 1A depicts the resulting structure 100A.

Next, dopants are implanted into the structure 100A using a conventional technique to form shallow source/drain areas 108. The resulting structure is shown in FIG. 1B.

Next, insulative sidewall spacers are 110 formed by forming an insulator layer over structure 100B and then removing portions of the insulator layer. The resulting structure is shown in FIG. 1C.

Next, dopants are implanted into the structure 100C to form conventional source/drain areas 112. The resulting structure 100D is shown in FIG. 1D.

Next, to activate the dopants implanted in shallow source/drain areas 108 and source/drain areas 112, the structure 100D is heated using, e.g., a rapid thermal annealing (RTA) to a temperature of 400 to 500° C. for approximately 10 seconds.

Next, a silicide layer such as titanium (Ti) or Cobalt (Co) is formed over structure 100D. The resulting structure is next heated to a temperature of approximately 400 to 700° C. to react the silicide layer with exposed portions of the silicon substrate layer 102 (hereafter "silicidation reaction").

Providing energy, such as heat, deactivates some dopants in the shallow source/drain areas 108 and source/drain areas 112. However, common dopants such as arsenic (As) are known to deactivate at temperatures as low as 400° C. Dopant deactivation may not be a concern for dopant species with high solid solubilities in silicon and/or in lightly doped drain (LDD) regions. However, careful attention must be paid to heating for larger dopant atoms such as antimony (Sb) or indium (In) and/or where required doping levels are above the equilibrium solubility of silicon. The silicidation reaction occurring between about 400 to 700° C. may be sufficient to cause significant loss of available charge carriers in the shallow source/drain areas 108 and source/drain areas 112.

A further side effect of heating is the diffusion of active carriers from the shallow source/drain areas 108 and source/drain areas 112. The diffusion effectively increases the depth of the source/drain areas, possibly beyond acceptable design depths. The diffusion is a particular problem when ultra shallow source/drain regions are desired.

Thus, what is needed is a method to form CMOS devices having ultra shallow source/drain regions with acceptable carrier concentrations and shallow depth.

SUMMARY

One embodiment of the present invention includes a method of forming a CMOS structure, the method including the acts of: forming a gate structure over a substrate layer; forming a silicide layer over the substrate layer; forming shallow source/drain areas in the substrate layer; forming an oxide diffusion barrier layer over the structure; forming a metal absorption layer over the oxide diffusion barrier layer; and melting portions of the substrate layer directly overlying the shallow source/drain areas, thereby transforming the shallow source/drain areas into shallow source/drain regions. In one embodiment, the act of melting includes exposing the metal absorption layer to pulsed laser beams.

Various embodiments of the present invention will be more fully understood in light of the following detailed description taken together with the accompanying drawings.

BRIEF DESCRIPTION OF THE DRAWINGS

Note that use of the same reference numbers in different figures indicates the same or like elements.

DETAILED DESCRIPTION

An embodiment of the present invention includes a process to fabricate a CMOS structure having ultra shallow source/drain regions. FIGS. 1A and 2 through 6 illustrate, in cross-section, a sequence, in accordance with an embodiment of the present invention, for fabricating a CMOS device.

Figure 1A:
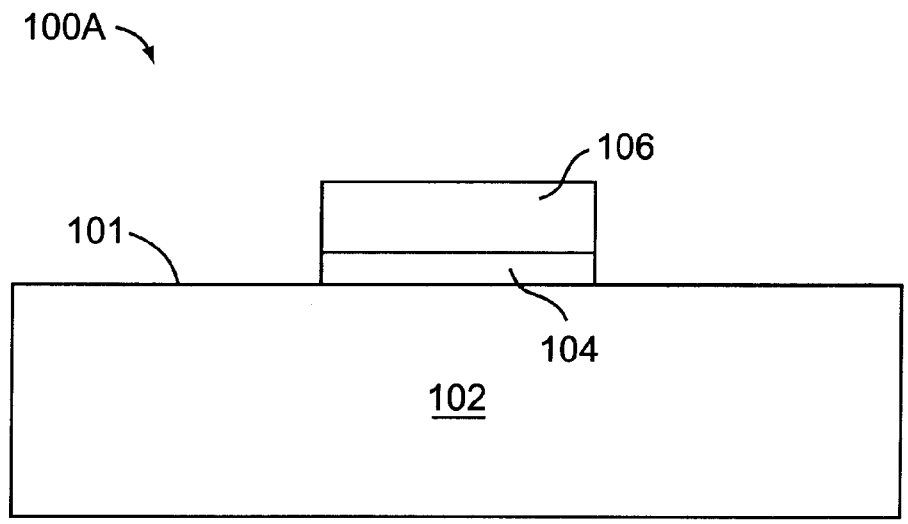
FIGS. 1A–1D depict formation of a conventional CMOS device.
Figure 1B:
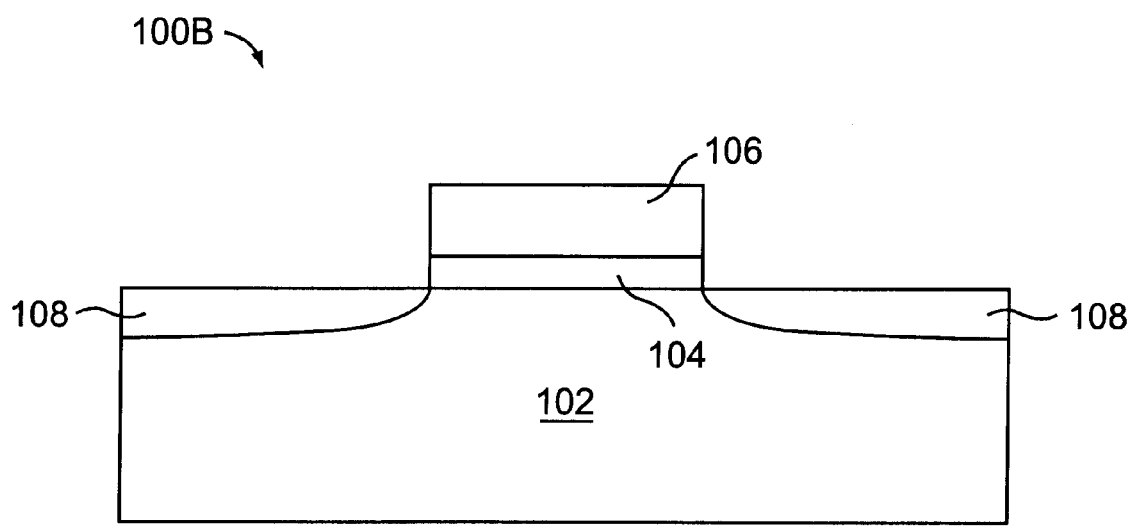
Figure 1C:
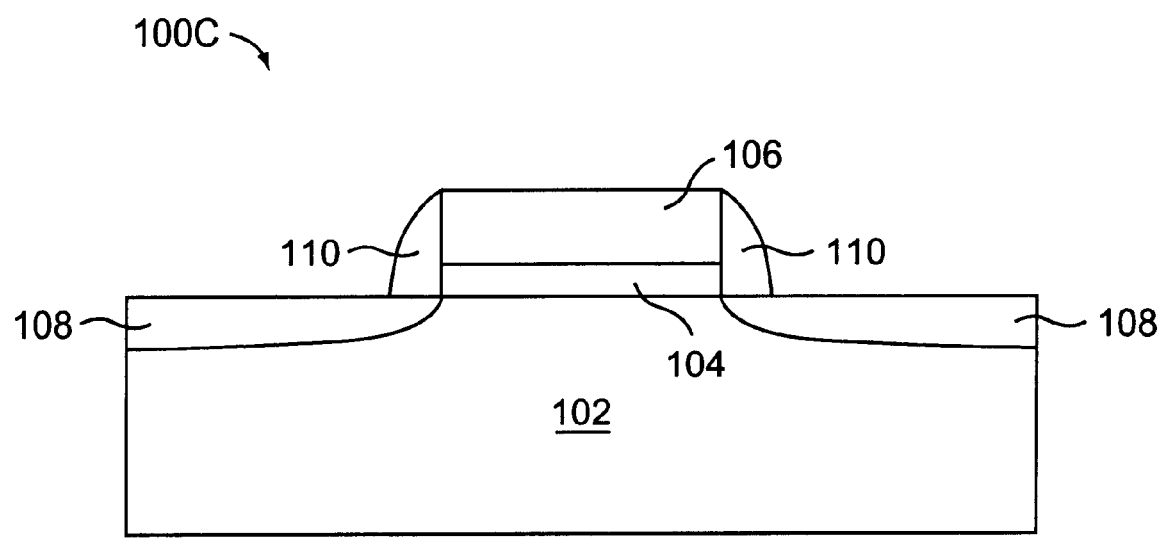
Figure 1D:
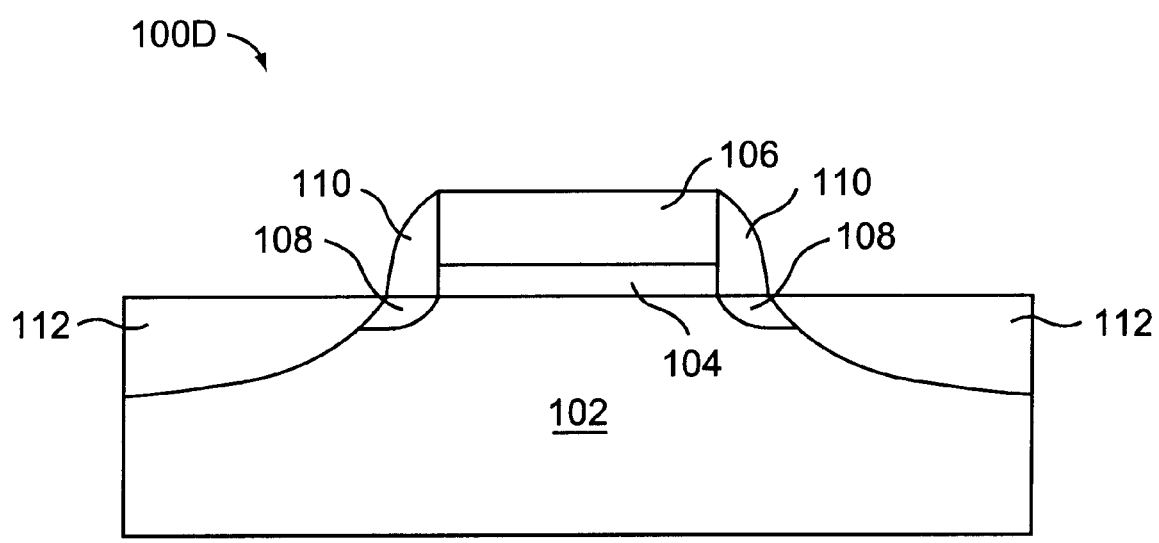

Referring to the structure 100A described with respect to FIG. 1A, suitable thicknesses of oxide layer 104 and gate structure 106 are respectively 2–5 nm and 100–200 nm.

Next, an insulator layer is formed over structure 100A by, e.g., a low pressure chemical vapor deposition (LPCVD) process and then portions of the insulator layer are removed by, e.g., an anisotropic etch technique to produce conventional sidewall spacers 202. A suitable width, i.e., along the X-axis shown in FIG. 2, of each of the sidewall spacers 202 is 40–80 nm.

Next, source/drain areas are formed in the structure 100A. A suitable technique for forming source/drain areas 206 is to implant dopants having a dosage level of approximately $1 \times 10^{15}$ ions/cm$^2$ to a depth of approximately 700 to 1500 Å from the top surface 101 of substrate layer 102. To form a p-type CMOS device, suitable dopants include boron (B) or indium (In). To form an n-type CMOS device, suitable dopants include arsenic (As), phosphorus (P), or antimony (Sb).

Figure 2:
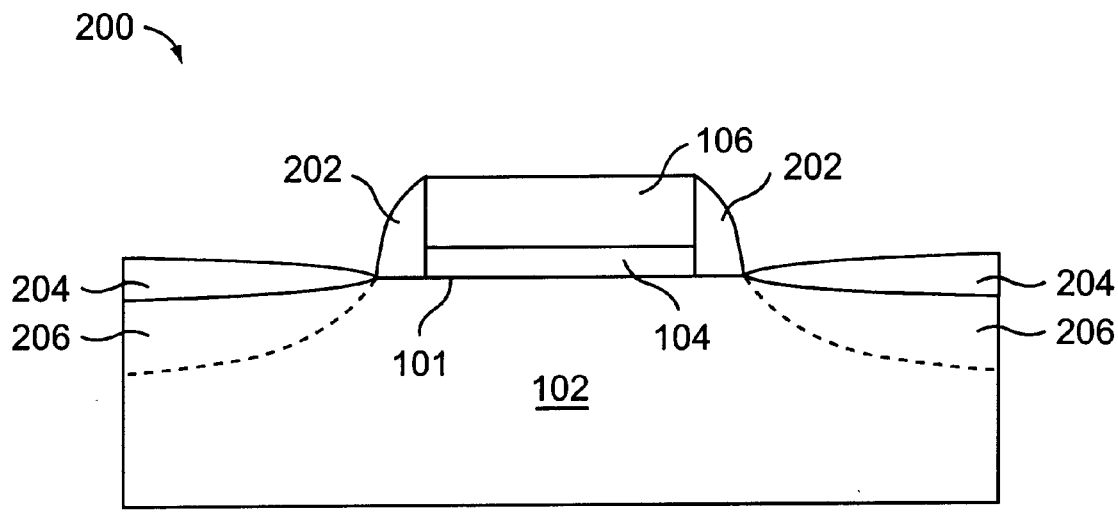
FIG. 2 depicts a structure 200 having spacers 202, silicide layers 204, and implanted source/drain areas 206.

Next, a silicide layer (e.g., titanium silicide ($TiSi_2$) or cobalt silicide ($CoSi_2$)) is formed over the resulting structure by, for example, metal sputtering. The resulting structure is next heated to a temperature of approximately 400 to 500° C. to react the silicide layer with exposed portions of the silicon substrate layer 102. Next, the unreacted silicide layer, i.e., the silicide layer that covers the spacers 202 and gate structure 106, is removed by, for example, a conventional etch technique. FIG. 2 depicts a resulting structure 200 having spacers 202, silicide layers 204, and source/drain areas 206.

Figure 3:
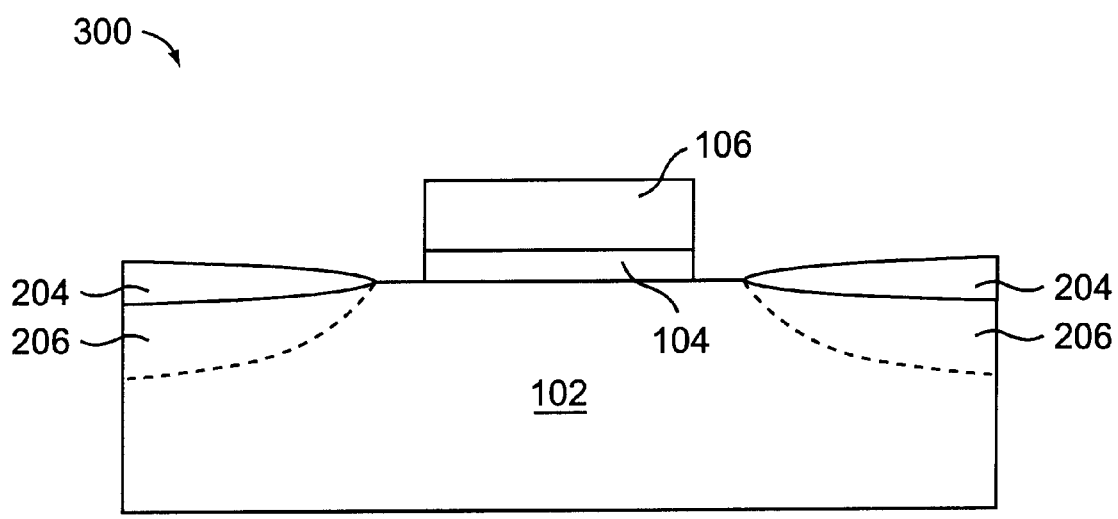
FIG. 3 depicts a structure 300 following removal of sidewall spacers 202.

Next, sidewall spacers 202 are removed by, for example, a conventional wet chemical etching technique. The resulting structure 300 is shown in FIG. 3.

A subsequent optional step includes implanting a preamorphization dopant species (e.g., silicon (Si) or germanium (Ge)), having a dosage level of approximately $5 \times 10^{14}$ to $1 \times 10^{15}$ ions/cm$^2$, into structure 300 to a depth between 300 to 700 Å below top surface 101.

Figure 4:
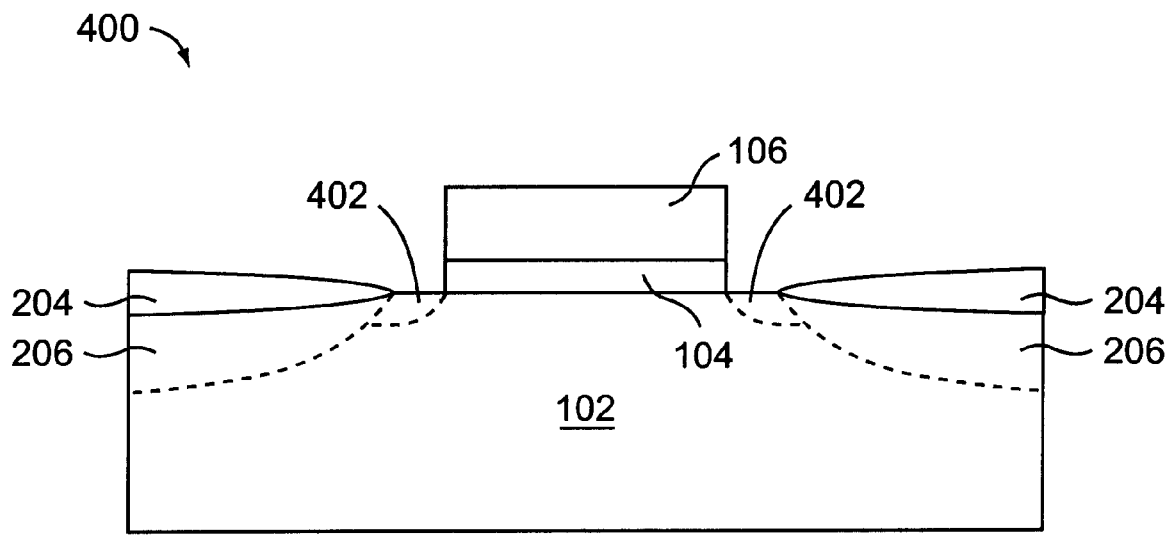
FIG. 4 depicts a structure 400 with implanted shallow source/drain areas 402 shown in broken lines.

Next, shallow source/drain areas are formed. A suitable technique to form shallow source/drain areas 402 is to implant dopants having a dosage level of approximately $5 \times 10^{14}$ to $1 \times 10^{15}$ ions/cm$^2$ to a target depth of approximately 300 to 700 Å below top surface 101. The same dopant material used to form source/drain areas 206 is used to form shallow source/drain areas. FIG. 4 depicts the resulting structure 400 with the shallow source/drain areas 402 shown in broken lines.

Next, an oxide diffusion barrier layer 502 is formed over structure 400 by, for example, depositing an oxide layer using a conventional chemical vapor deposition (CVD) process to a thickness of, e.g., 10–20 nm.

Figure 5:
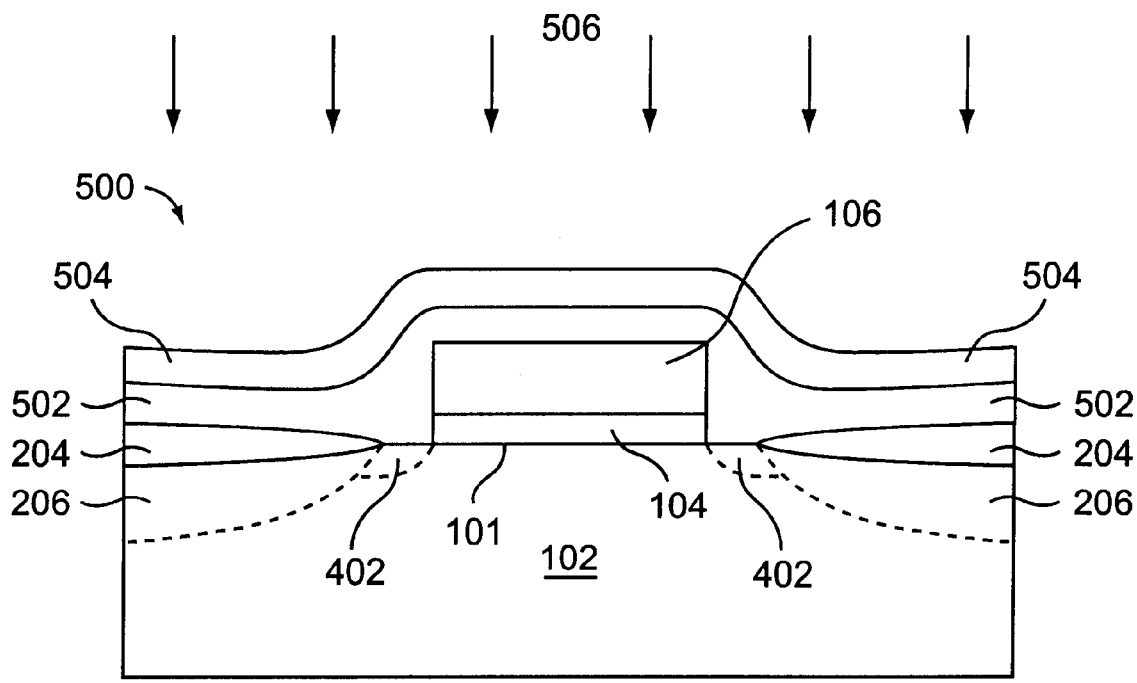
FIG. 5 depicts a structure 500 having oxide diffusion barrier layer 502 and metal absorption layer 504.

Next, a metal absorption layer 504 being, e.g., titanium (Ti), titanium-nitride (TiN), tantalum (Ta), or tantalum-nitride (TaN) is formed over the resulting structure to a suitable thickness of 10–20 nm by, e.g., plasma enhanced chemical vapor deposition (PECVD) performed at a temperature between 200 to 400° C. FIG. 5 depicts the resulting structure 500 having oxide diffusion barrier layer 502 and metal absorption layer 504.

Next, as depicted in FIG. 5, excimer laser beams 506 expose the structure 500 to diffuse dopants in the shallow source/drain areas 402 and source/drain areas 206, thereby forming respective shallow source/drain regions 602 and source/drain regions 604. Suitable depths of shallow source/drain regions 602 and source/drain regions 604 are respectively 10–30 nm and 80–150 nm. A suitable manner to apply excimer laser beams 506 is to employ a conventional "selective laser activation" (SELA) technique. A suitable SELA technique includes exposing structure 500 to approximately 5 to 10 laser beam pulses, each pulse having the following characteristics: 1) approximately 1 ns in duration, 2) a wavelength of approximately 308 nm, and 3) providing an energy of approximately 1 joule/cm$^2$ to metal absorption layer 504 of structure 500.

Effectively, each pulse of the applied SELA technique liquifies the region of silicon substrate layer 102 directly overlying the shallow source/drain regions 402 to a depth of 1 to 3 nm from top surface 101 for a very short duration, i.e., several nanoseconds. The melted layer then quickly re-solidifies, i.e., within several nanoseconds, by liquid phase epitaxy. The high re-solidification rate traps dopants in silicon lattice sites of silicon substrate layer 102, thereby forming active dopant concentrations in the shallow source/drain regions 402 above an equilibrium solid solubility of silicon substrate layer 102. Further, the shallow source/drain regions exhibit uniform active carrier concentrations along the (−)Y direction from top surface 101.

During the application of excimer laser beams 506, metal absorption layer 504 shields gate structure 106, thereby preventing melting of gate structure 106. Further, oxide diffusion barrier layer 502 prevents diffusion of metal from metal absorption layer 504 into the silicon substrate.

Next, metal absorption layer 504 and oxide diffusion barrier layer 502 are removed, in order, by, e.g., a conventional etch technique.

Figure 6:
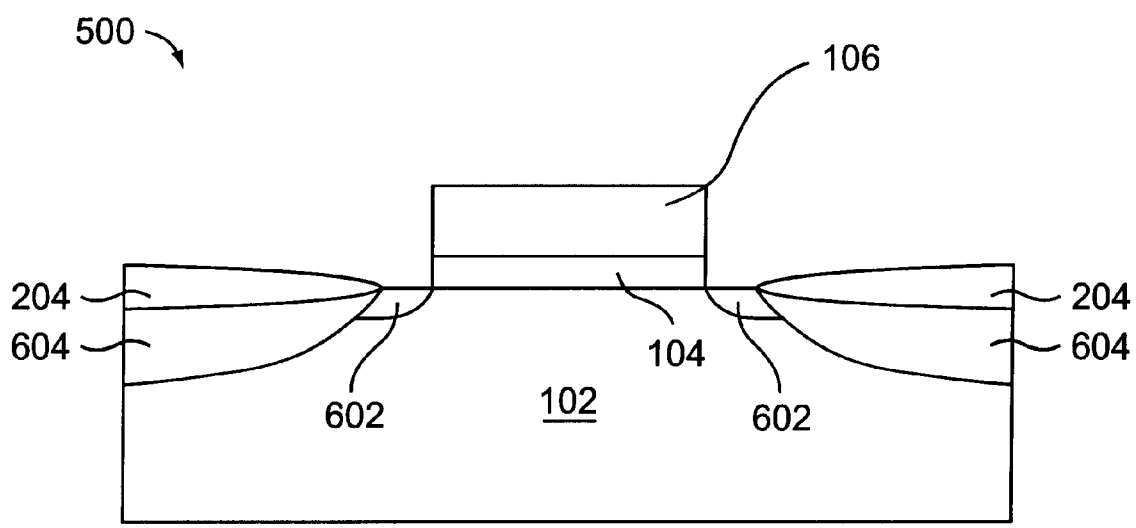
FIG. 6 depicts a structure 600 formed in accordance with an embodiment of the present invention.

FIG. 6 depicts a structure 600 having shallow source/drain regions 602 and source/drain regions 604 formed in accordance with an embodiment of the present invention. Thus, an embodiment of the present invention provides a method for forming a CMOS device having ultra shallow source/drain regions with high and uniform dopant concentrations. The method avoids the unacceptable active carrier diffusion in shallow source/drain regions and loss of available charge carriers associated with the process described with respect to the FIGS. 1A–1D.

The above-described embodiments are illustrative and not limiting. It will thus be obvious to those skilled in the art that various changes and modifications may be made without departing from this invention in its broader aspects. For example, with respect to the excimer laser beams 506, it will be obvious to one of skill in the art that the beam energy, number of pulses, frequency of pulses, and time between pulses can be varied to liquify various depths of the silicon substrate layer 102 directly overlying the shallow source/drain areas 402 for various durations. Therefore, the appended claims encompass all such changes and modifications as fall within the scope of this invention.

What is claimed is:

1. A method of forming a CMOS structure comprising the acts of:

forming a gate structure over a substrate layer;

forming oxide spacers on side walls of the gate structure;

introducing dopants into the substrate layer to form source/drain areas without melting portions of the substrate layer;

forming a silicide layer over the substrate layer before melting portions of the substrate layer;

removing the oxide spacers;

introducing dopants into the substrate layer, thereby forming shallow source/drain areas;

forming an oxide diffusion barrier layer over the gate structure and the shallow source/drain areas;

forming a metal absorption layer over the oxide diffusion barrier layer; and melting portions of the substrate layer directly overlying the shallow source/drain areas to form active dopant concentrations above an equilibrium solubility in the silicon substrate.

2. The method of claim 1 wherein the act of melting further comprises the act of exposing the metal absorption layer to pulsed laser beams.

3. The method of claim 2, wherein each laser beam pulse provides an energy of approximately 1 joule/cm$^2$.

4. The method of claim 3, wherein each laser beam pulse is approximately 308 nm in wavelength.

5. The method of claim 4 further comprises applying between 5 and 10 pulsed laser beam pulses.

6. The method of claim 1 further comprising implanting a preamorphization dopant species into the substrate layer following removing the oxide spacers.

7. The method of claim 1 wherein the act of introducing dopants into the substrate layer to form the source/drain areas further comprises implanting dopants.

8. The method of claim 1 wherein the act of forming shallow source/drain areas further comprises implanting dopants.

9. The method of claim 1 wherein the active dopant concentrations are substantially uniform in melted portions of the substrate layer.

10. The method of claim 1 further comprising removing the metal absorption layer.

11. The method of claim 10 further comprise removing the oxide diffusion barrier layer.

12. The method of claim 1 wherein the act of melting further comprises the act of melting a depth of approximately 1 to 3 nm from a surface of the substrate layer.

* * * * *